US012750025B2

(12) United States Patent
Chen

(10) Patent No.: US 12,750,025 B2
(45) Date of Patent: Sep. 29, 2026

(54) METHOD FOR PERFORMING COMMON MODE VOLTAGE RE-BIASING IN ANALOG FRONT-END CIRCUIT OF RECEIVER, ASSOCIATED COMMON MODE VOLTAGE RE-BIASING CIRCUIT, ASSOCIATED RECEIVER AND ASSOCIATED INTEGRATED CIRCUIT

(71) Applicant: Realtek Semiconductor Corp., HsinChu (TW)

(72) Inventor: Bing-Hung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 833 days.

(21) Appl. No.: 17/953,348

(22) Filed: Sep. 27, 2022

(65) Prior Publication Data

US 2023/0253939 A1 Aug. 10, 2023

(30) Foreign Application Priority Data

Feb. 7, 2022 (TW) .................................. 111104284

(51) Int. Cl.
*H03F 3/45* (2006.01)
*G05F 1/46* (2006.01)

(52) U.S. Cl.
CPC ........... *H03F 3/4565* (2013.01); *G05F 1/461* (2013.01); *H03F 2203/45072* (2013.01); *H03F 2203/45421* (2013.01)

(58) Field of Classification Search
CPC ......... H03F 3/4565; H03F 2203/45072; H03F 2203/45421; H03F 2203/45066; H03F 2203/45081; H03F 3/45995; G05F 1/461
USPC .......................................................... 330/277
See application file for complete search history.

(56) References Cited

U.S. PATENT DOCUMENTS 4,577,162 A * 3/1986 Peterson ................. H03F 1/303 330/261
5,914,638 A * 6/1999 He ....................... H03F 3/45977 330/258
2006/0214731 A1* 9/2006 Kelly ....................... H03F 1/086 330/292
2007/0061658 A1* 3/2007 Hsu .................. G01R 31/31716 714/742

(Continued)

*Primary Examiner* — Pinping Sun
(74) *Attorney, Agent, or Firm* — Winston Hsu

(57) ABSTRACT

A method for performing common mode voltage re-biasing in an analog front-end circuit of a receiver, an associated common mode voltage re-biasing circuit, the receiver and an associated integrated circuit are provided. The common mode voltage re-biasing circuit may include a control circuit and multiple switchable common mode voltage re-biasing sub-circuits. The control circuit generates at least one control signal according to a command, for controlling the common mode voltage re-biasing circuit to operate in a selected circuit configuration. The multiple switchable common mode voltage re-biasing sub-circuits select a predetermined circuit configuration from a first predetermined circuit configuration and a second predetermined circuit configuration according to the at least one control signal to be the selected circuit configuration to perform common mode voltage re-biasing operations corresponding to the selected circuit configuration, respectively.

9 Claims, 8 Drawing Sheets

(56) References Cited

U.S. PATENT DOCUMENTS

| | | | | |
|---|---|---|---|---|
| 2011/0169565 | A1* | 7/2011 | Nakamura | H03F 1/0266<br>330/69 |
| 2011/0298644 | A1* | 12/2011 | Ohba | H03F 3/005<br>341/155 |
| 2017/0331432 | A1* | 11/2017 | Zhang | H03F 3/005 |
| 2019/0098417 | A1* | 3/2019 | Littrell | H04R 3/04 |
| 2021/0367572 | A1* | 11/2021 | Kusuda | H03F 3/45197 |
| 2022/0196485 | A1* | 6/2022 | Panja | H03M 1/1245 |
| 2023/0402918 | A1* | 12/2023 | Hunter | H02M 3/1563 |
| 2023/0403023 | A1* | 12/2023 | Foley | H03F 3/45188 |

* cited by examiner

METHOD FOR PERFORMING COMMON MODE VOLTAGE RE-BIASING IN ANALOG FRONT-END CIRCUIT OF RECEIVER, ASSOCIATED COMMON MODE VOLTAGE RE-BIASING CIRCUIT, ASSOCIATED RECEIVER AND ASSOCIATED INTEGRATED CIRCUIT

BACKGROUND OF THE INVENTION

1. Field of the Invention

The present invention is related to circuit design, and more particularly, to a method for performing common mode voltage re-biasing in an analog front-end circuit of a receiver, an associated common mode voltage re-biasing circuit, the receiver and an associated integrated circuit (IC).

2. Description of the Prior Art

According to the related art, different stages of circuits in a conventional analog front-end circuit may have different common mode voltages, respectively, to allow subsequent circuit to operate in a suitable voltage range. However, certain problems may occur. For example, when a system manufacturer tries to implement electronic products conforming to newer communications specifications, the existing circuit characteristics of the conventional analog front-end circuit may make the whole system be unable to simultaneously meeting various requirements, which may result in test failures. Therefore, there is a need for a novel method and associated architecture to implement electronic products conforming to newer communications specifications without introducing side effects, or in a way that is less likely to introduce a side effect.

SUMMARY OF THE INVENTION

An object of the present invention is to provide a method for performing common mode voltage re-biasing in an analog front-end circuit of a receiver, an associated common mode voltage re-biasing circuit, the receiver and an associated IC, in order to solve the problems mentioned above.

Another object of the present invention is to provide a method for performing common mode voltage re-biasing in an analog front-end circuit of a receiver, an associated common mode voltage re-biasing circuit, the receiver and an associated IC, in order to achieve optimal performance of an electronic product.

At least one embodiment of the present invention provides a common mode voltage re-biasing circuit for performing common mode voltage re-biasing in an analog front-end circuit of a receiver. The common mode voltage re-biasing circuit may comprise a control circuit and multiple switchable common mode voltage re-biasing sub-circuits that are coupled to the control circuit, and the multiple switchable common mode voltage re-biasing sub-circuits may comprise a first switchable common mode voltage re-biasing sub-circuit and a second switchable common mode voltage re-biasing sub-circuit. The control circuit can be configured to generate at least one control signal according to a command, for controlling the common mode voltage re-biasing circuit to operate in a selected circuit configuration. In addition, the multiple switchable common mode voltage re-biasing sub-circuits can be configured to select a predetermined circuit configuration from a first predetermined circuit configuration and a second predetermined circuit configuration according to the at least one control signal to be the selected circuit configuration to perform common mode voltage re-biasing operations corresponding to the selected circuit configuration, respectively. For example, the first switchable common mode voltage re-biasing sub-circuit can be positioned in the analog front-end circuit of the receiver and coupled to a first differential input terminal of the receiver, and the second switchable common mode voltage re-biasing sub-circuit can be positioned in the analog front-end circuit of the receiver and coupled to a second differential input terminal of the receiver.

According to some embodiments, the present invention further provides the receiver comprising the above-mentioned common mode voltage re-biasing circuit, wherein the receiver may comprise: a physical layer (PHY) circuit, wherein the PHY circuit comprises the common mode voltage re-biasing circuit; and an upper layer circuit, configured to select a predetermined communications mode from a plurality of predetermined communications modes to be a selected communications mode, and send the command according to the selected communications mode, to make the selected circuit configuration correspond to the selected communications mode.

According to some embodiments, the present invention further provides an IC comprising the above-mentioned receiver.

At least one embodiment of the present invention provides a method for performing common mode voltage re-biasing in an analog front-end circuit of a receiver. The method may comprise: generating at least one control signal according to a command, for controlling a common mode voltage re-biasing circuit to operate in a selected circuit configuration; and utilizing multiple switchable common mode voltage re-biasing sub-circuits of the common mode voltage re-biasing circuit to select a predetermined circuit configuration from a first predetermined circuit configuration and a second predetermined circuit configuration according to the at least one control signal to be the selected circuit configuration to perform common mode voltage re-biasing operations corresponding to the selected circuit configuration, respectively, wherein the multiple switchable common mode voltage re-biasing sub-circuits comprise a first switchable common mode voltage re-biasing sub-circuit and a second switchable common mode voltage re-biasing sub-circuit, and the first switchable common mode voltage re-biasing sub-circuit and the second switchable common mode voltage re-biasing sub-circuit are positioned in the analog front-end circuit of the receiver and are coupled to a first differential input terminal and a second differential input terminal of the receiver, respectively.

It is an advantage of the present invention that, through a carefully designed control mechanism, the method, the common mode voltage re-biasing circuit, the receiver and the IC of the present invention can dynamically control common mode voltage re-biasing operations to correspond to the currently selected circuit configuration, and more particularly, utilizing the upper layer circuit such as a media access control (MAC) layer circuit to send the command according to the selected communications mode, to make the selected circuit configuration correspond to the selected communications mode, in order to guarantee the communications quality of each communications mode of the plurality of predetermined communications modes. In comparison with the related art, the method, the common mode voltage re-biasing circuit, the receiver and the IC of the present invention can achieve optimal performance of an electronic product without introducing side effects, or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
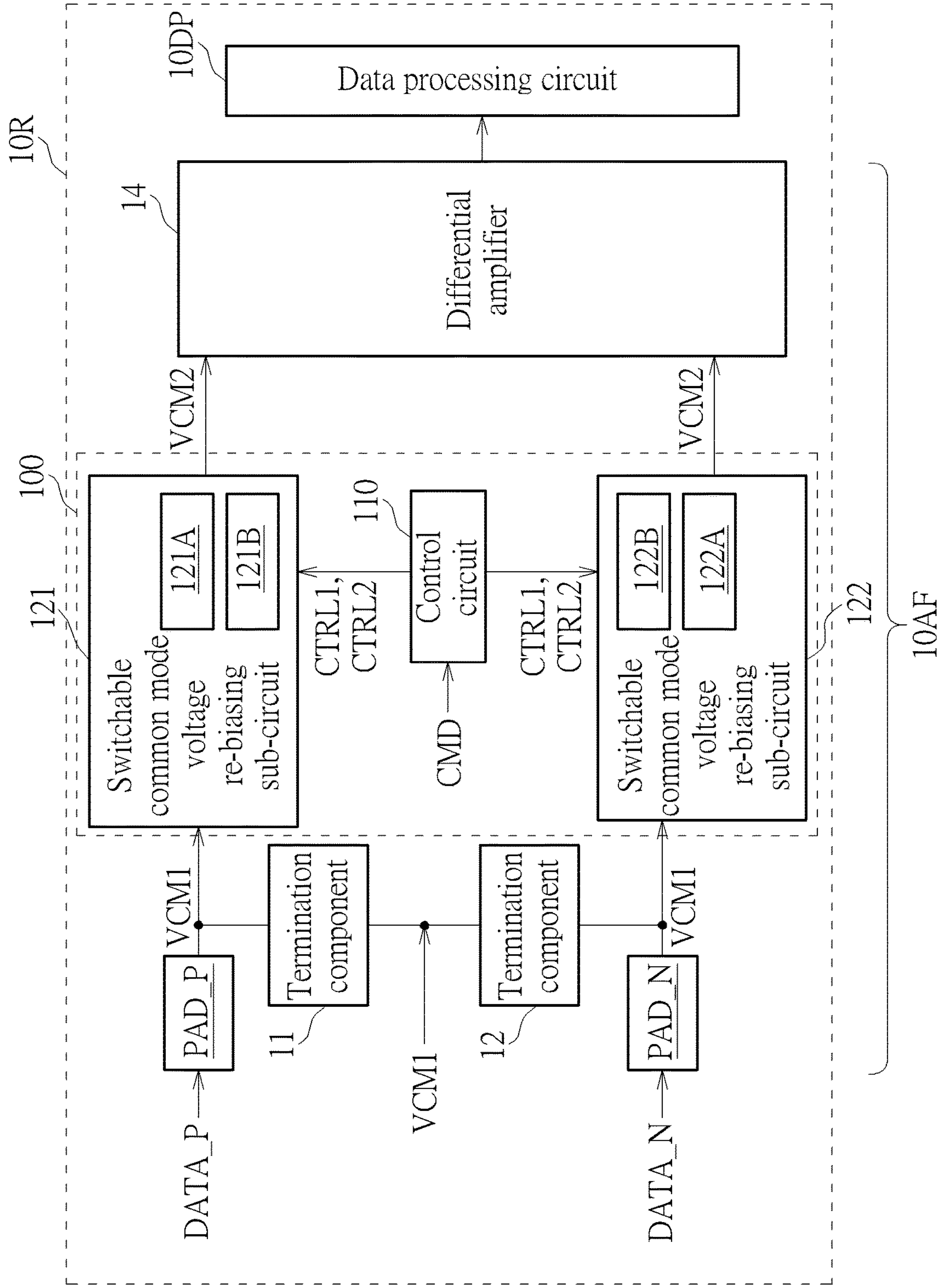
FIG. 1 is a diagram illustrating a common mode voltage re-biasing circuit for performing common mode voltage re-biasing in an analog front-end circuit of a receiver according to an embodiment of the present invention.

FIG. 1 is a diagram illustrating a common mode voltage re-biasing circuit 100 for performing common mode voltage re-biasing in an analog front-end circuit 10AF of a receiver 10R according to an embodiment of the present invention. The receiver 10R may comprise the analog front-end circuit 10AF and a data processing circuit 10DP, and the analog front-end circuit 10AF may comprise a set of differential input terminals of the receiver 10R, such as differential input terminals PAD_P and PAD_N (which may be regarded as the positive input terminal and the negative input terminal among this set of differential input terminals), and comprise termination components 11 and 12, the common mode voltage re-biasing circuit 100 and a differential amplifier 14. For example, the termination components 11 and 12 may be implemented by way of resistors (e.g., two resistors having the same resistance value), but the present invention is not limited thereto. In some examples, termination components 11 and 12 may be implemented by way of resistors, capacitors, inductors, etc.

As shown in FIG. 1, the common mode voltage re-biasing circuit 100 may comprise a control circuit 110, and comprise multiple switchable common mode voltage re-biasing sub-circuits that are coupled to the control circuit 110, such as the switchable common mode voltage re-biasing sub-circuits 121 and 122, where the switchable common mode voltage re-biasing sub-circuit 121 may comprise a first-type common mode voltage re-biasing sub-circuit 121A and a second-type common mode voltage re-biasing sub-circuit 121B respectively belonging to a first type and a second type, and the switchable common mode voltage re-biasing sub-circuit 122 may comprise a first-type common mode voltage re-biasing sub-circuit 122A and a second-type common mode voltage re-biasing sub-circuit 122B respectively belonging to the first type and the second type. More particularly, the switchable common mode voltage re-biasing sub-circuit 121 may be positioned in the analog front-end circuit 10AF of the receiver 10R and coupled to the differential input terminal PAD_P of the receiver 10R, and the switchable common mode voltage re-biasing sub-circuit 122 may be positioned in the analog front-end circuit 10AF of the receiver 10R and coupled to the differential input terminal PAD_N of the receiver 10R.

In this architecture, the control circuit 110 can generate at least one control signal such as the control signals CTRL1 and CTRL2 according to a command CMD, for controlling the common mode voltage re-biasing circuit 100 to operate in a selected circuit configuration. In addition, the multiple switchable common mode voltage re-biasing sub-circuits such as the switchable common mode voltage re-biasing sub-circuits 121 and 122 can select a predetermined circuit configuration from a first predetermined circuit configuration and a second predetermined circuit configuration according to the aforementioned at least one control signal such as the control signals CTRL1 and CTRL2 to be the selected circuit configuration to perform common mode voltage re-biasing operations corresponding to the selected circuit configuration, respectively.

For better comprehension, the first-type common mode voltage re-biasing sub-circuit 121A and the second-type common mode voltage re-biasing sub-circuit 121B in the switchable common mode voltage re-biasing sub-circuit 121 may have a first circuit architecture and a second circuit architecture, respectively, and the first-type common mode voltage re-biasing sub-circuit 122A and the second-type common mode voltage re-biasing sub-circuit 122B in the switchable common mode voltage re-biasing sub-circuit 122 may have another first circuit architecture that is the same as the first circuit architecture and another second circuit architecture that is the same as the second circuit architecture, respectively, where the second circuit architecture is different from the first circuit architecture. In addition, the control circuit 110 may selectively enable the first-type common mode voltage re-biasing sub-circuits 121A and 122A or enable the second-type common mode voltage re-biasing sub-circuits 121B and 122B through the aforementioned at least one control signal such as the control signals CTRL1 and CTRL2. For example, when enabling the first-type common mode voltage re-biasing sub-circuits 121A and 122A, the control circuit 110 may disable the second-type common mode voltage re-biasing sub-circuits 121B and 122B. For another example, when enabling the second-type common mode voltage re-biasing sub-circuits 121B and 122B, the control circuit 110 may disable the first-type common mode voltage re-biasing sub-circuits 121A and 122A.

The differential input signals DATA_P and DATA_N on the differential input terminals PAD_P and PAD_N may have a common mode voltage VCM1 (labeled "VCM1" on the two rightward paths from the differential input terminals PAD_P and PAD_N respectively for brevity), which is equal to the common mode voltage VCM1 at the node between the termination components 11 and 12, such as a predetermined common mode voltage input to this node. In this situation, the common mode voltage re-biasing circuit 100 can perform common mode voltage re-biasing on the differential input signals DATA_P and DATA_N, and more particularly, establish a common mode voltage VCM2 (labeled "VCM2" on the two rightward paths from the switchable common mode voltage re-biasing sub-circuits 121 and 122 for brevity), such as another predetermined common mode voltage, to replace the common mode voltage VCM1. During maintaining the common mode voltage VCM2, the common mode voltage re-biasing circuit 100 can dynamically control the common mode voltage re-biasing operations to correspond to the currently selected circuit configuration, to guarantee the communications quality of various communications modes.

For example, in various communications modes, the analog front-end circuit 10AF can correctly perform analog front-end processing, and more particularly, the differential amplifier 14 can correctly receive the adjusted differential input signals (e.g., adjusted versions of the differential input signals DATA_P and DATA_N, respectively on the two rightward paths from the switchable common mode voltage re-biasing sub-circuits 121 and 122 to the differential amplifier 14) that have been re-biased and have the common mode voltage VCM2, to obtain a series of logic values carried by the differential input signals DATA_P and DATA_N, and the data processing circuit 10DP can perform data processing on this series of logic values to allow the whole system comprising the receiver 10R to operate correctly. Therefore, the common mode voltage re-biasing circuit 100, the receiver 10R and the associated IC of the present invention can achieve the optimal performance of an electronic product without introducing side effects, or in a way that is less likely to introduce a side effect.

According to some embodiments, for a set of differential input signals received by the receiver 10R, such as the differential input signals DATA_P and DATA_N, a first frequency response of any switchable common mode voltage re-biasing sub-circuit among the first switchable common mode voltage re-biasing sub-circuit and the second switchable common mode voltage re-biasing sub-circuit when operating in the first predetermined circuit configuration and a second frequency response of the aforementioned any switchable common mode voltage re-biasing sub-circuit when operating in the second predetermined circuit configuration are different from each other. For example, for the set of differential input signals such as the differential input signals DATA_P and DATA_N, the first circuit architecture and the other first circuit architecture may play the role of low-pass filters, and the second circuit architecture and the other second circuit architecture can play the role of high-pass filters, but the invention is not limited thereto.

According to some embodiments, any of the first circuit architecture and the other first circuit architecture may comprise a first resistor and a second resistor, and any of the second circuit architecture and the other second circuit architecture may comprise a third resistor and a capacitor, but the invention is not limited thereto. In some embodiments, the first circuit architectures and/or the second circuit architectures may vary.

Figure 2:
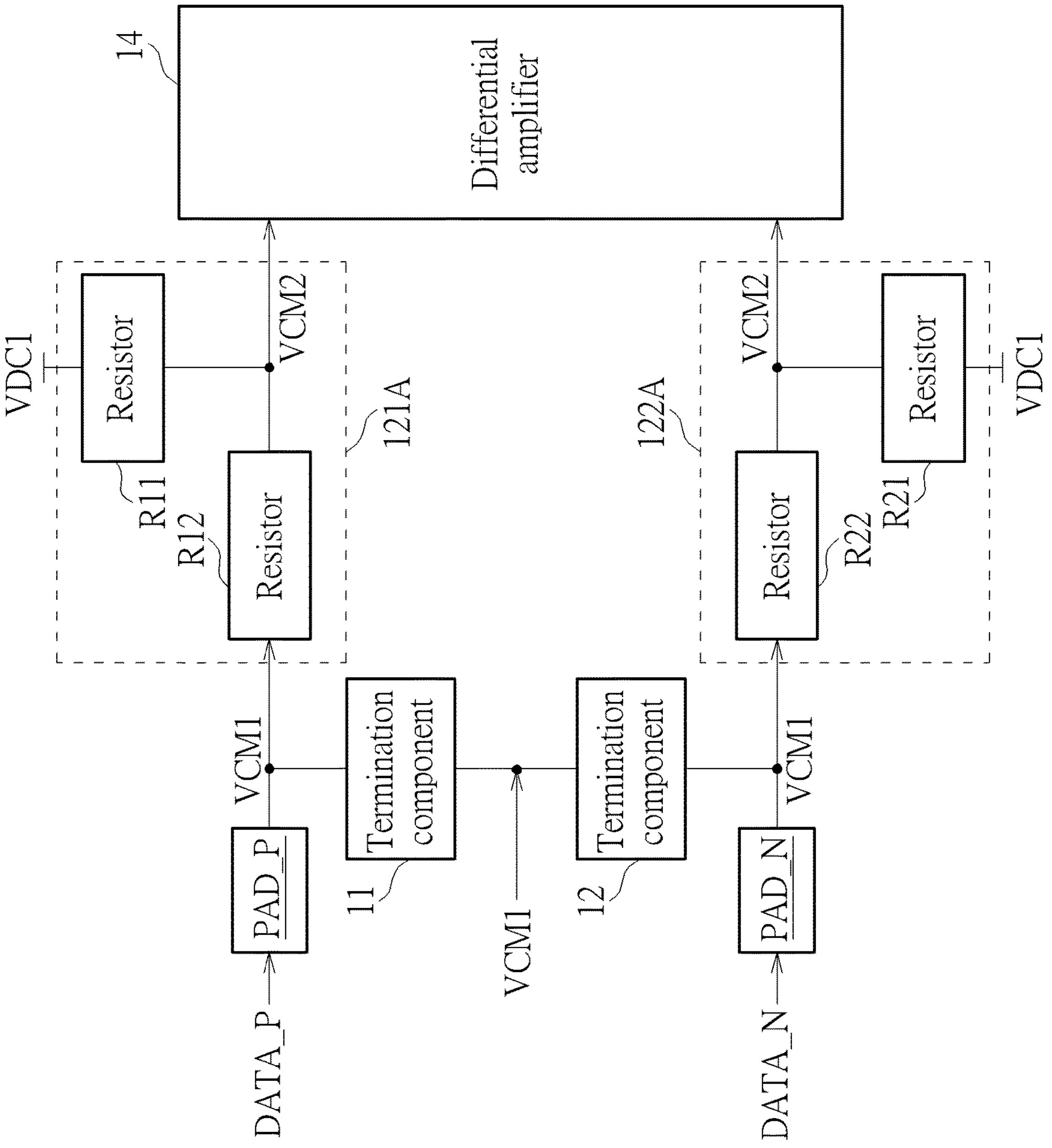
FIG. 2 is a diagram illustrating a first predetermined circuit configuration involved with a dynamic circuit configuration control scheme of a method for performing common mode voltage re-biasing in an analog front-end circuit of a receiver such as the receiver shown in FIG. 1 according to an embodiment of the present invention.

FIG. 2 is a diagram illustrating a first predetermined circuit configuration involved with a dynamic circuit configuration control scheme of a method for performing common mode voltage re-biasing in an analog front-end circuit of a receiver, such as the analog front-end circuit 10AF of the receiver 10R shown in FIG. 1, according to an embodiment of the present invention. The method is applicable to the common mode voltage re-biasing circuit 100 (e.g., the components therein), the receiver 10R, and the associated IC. The reference voltage VDC1 may represent a predetermined reference voltage. The resistors R11 and R12 can be taken as examples of the first resistor and the second resistor, respectively, and the resistors R21 and R22 can also be taken as examples of the first resistor and the second resistor, respectively. As the respective resistance of the resistors R12 and R22 can be very high, the resistor R12 and the parasitic capacitance on the rightward path from the resistor R12 to the differential amplifier 14 can form a low-pass filter, and the resistor R22 and the parasitic capacitance on the rightward path from the resistor R22 to the differential amplifier 14 can also form a low-pass filter. For brevity, similar descriptions for this embodiment are not repeated in detail here.

Figure 3:
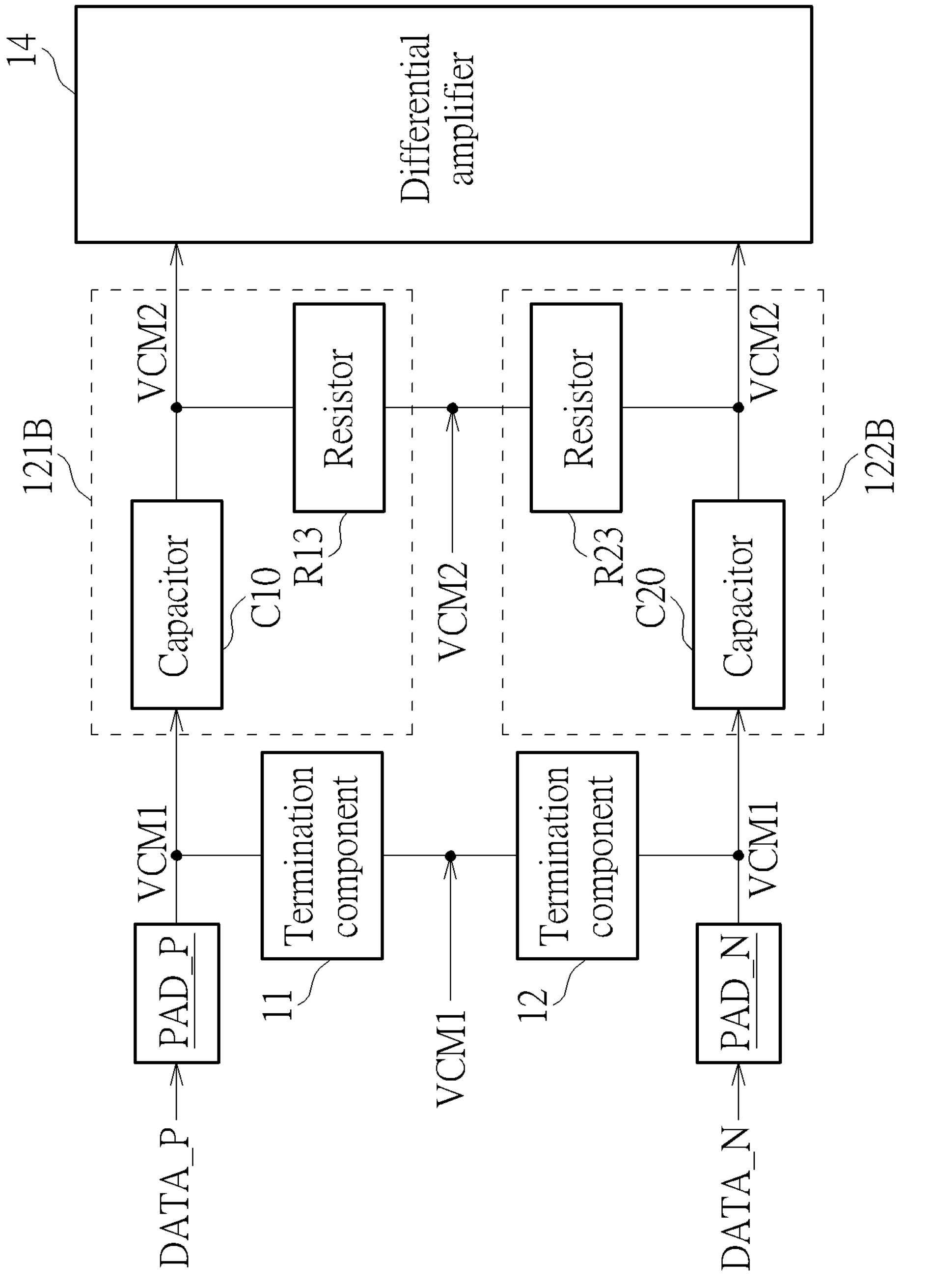
FIG. 3 is a diagram illustrating a second predetermined circuit configuration involved with the dynamic circuit configuration control scheme according to an embodiment of the present invention.

FIG. 3 is a diagram illustrating a second predetermined circuit configuration involved with the dynamic circuit configuration control scheme according to an embodiment of the present invention. The resistor R13 and the capacitor C10 can be taken as examples of the third resistor and the capacitor, respectively, and the resistor R23 and the capacitor C20 can also be taken as examples of the third resistor and the capacitor, respectively. The resistor R13 and the capacitor C10 can form a high-pass filter, and the resistor R23 and the capacitor C20 can also form a high-pass filter. The common mode voltage VCM2 on the rightward paths from the capacitors C10 and C20 to the differential amplifier 14 can be equal to the common mode voltage VCM2 at the node between the resistors R13 and R23, such as a predetermined common mode voltage input to this node, and this predetermined common mode voltage can be generated according to a bandgap reference voltage. For brevity, similar descriptions for this embodiment are not repeated in detail here.

Figure 4:
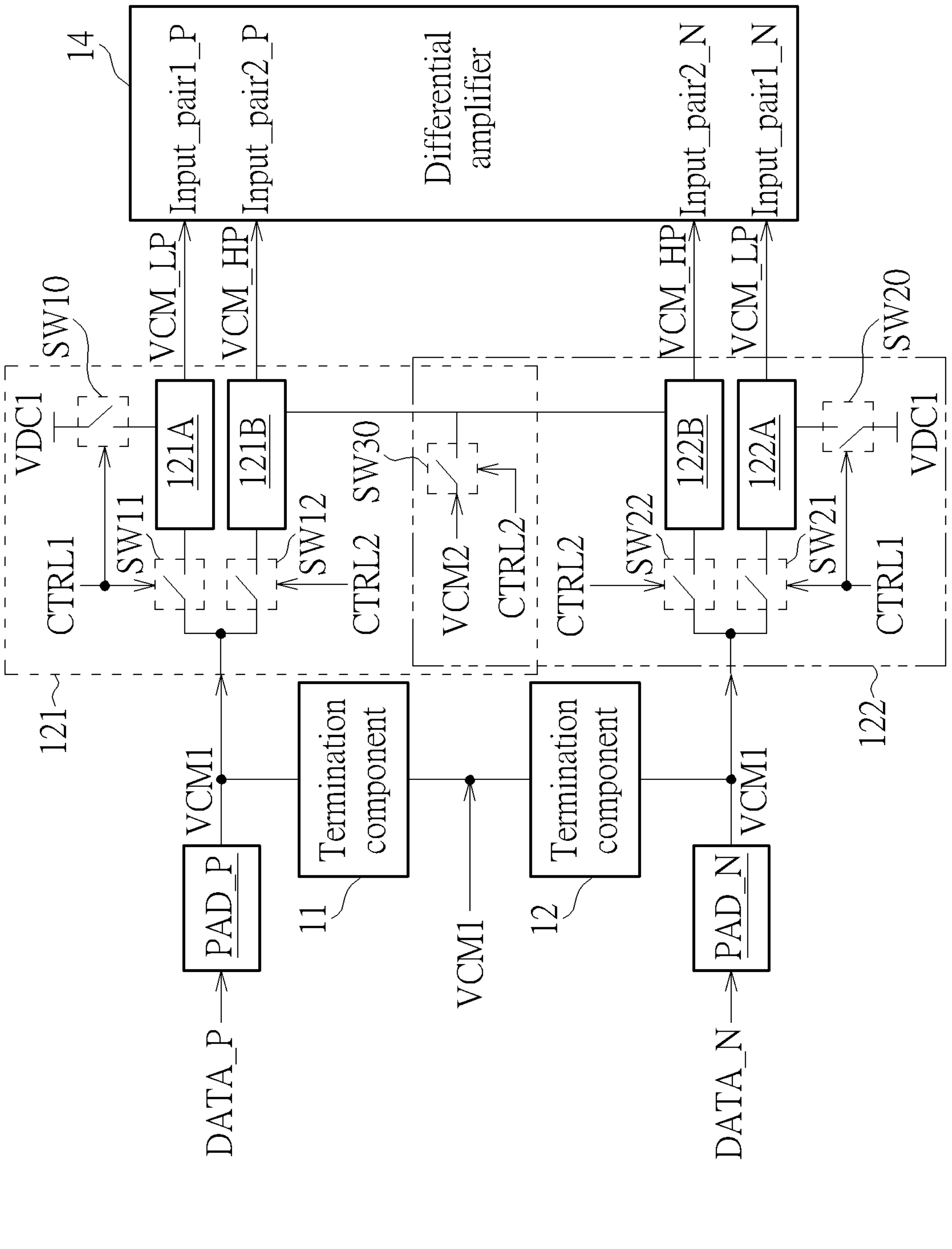
FIG. 4 is a diagram illustrating a first switching control scheme of the method according to an embodiment of the present invention.

FIG. 4 is a diagram illustrating a first switching control scheme of the method according to an embodiment of the present invention. The switchable common mode voltage re-biasing sub-circuit 121 may further comprise switches SW10-SW12 and SW30, and the switchable common mode voltage re-biasing sub-circuit 122 may further comprise switches SW20-SW22 and SW30, where the switchable common mode voltage re-biasing sub-circuits 121 and 122 may share the switch SW30. When the control circuit 110 enables the first-type common mode voltage re-biasing sub-circuits 121A and 122A through the control signal CTRL1 and disables the second-type common mode voltage re-biasing sub-circuits 121B and 122B through the control signal CTRL2, the control signal CTRL1 is in the enabling state to turn on the switches SW10, SW11, SW20 and SW21, and the control signal CTRL2 is in the disabling state to turn off the switches SW12, SW22 and SW30. In this situation, the common mode voltage VCM2 can also be written as the common mode voltage VCM_LP to indicate that these first circuit architectures acting as low-pass filters are enabled. When the control circuit 110 disables the first-type common mode voltage re-biasing sub-circuits 121A and 122A through the control signal CTRL1 and enables the second-type common mode voltage re-biasing sub-circuits 121B and 122B through the control signal CTRL2, the control signal CTRL1 is in the disabling state to turn off the switches SW10, SW11, SW20 and SW21, and the control signal CTRL2 is in the enabling state to turn on the switches SW12, SW22 and SW30. In this situation, the common mode voltage VCM2 can also be written as the common mode voltage VCM HP to indicate that these second circuit architectures acting as high-pass filters are enabled. For brevity, similar descriptions for this embodiment are not repeated in detail here.

Figure 5:
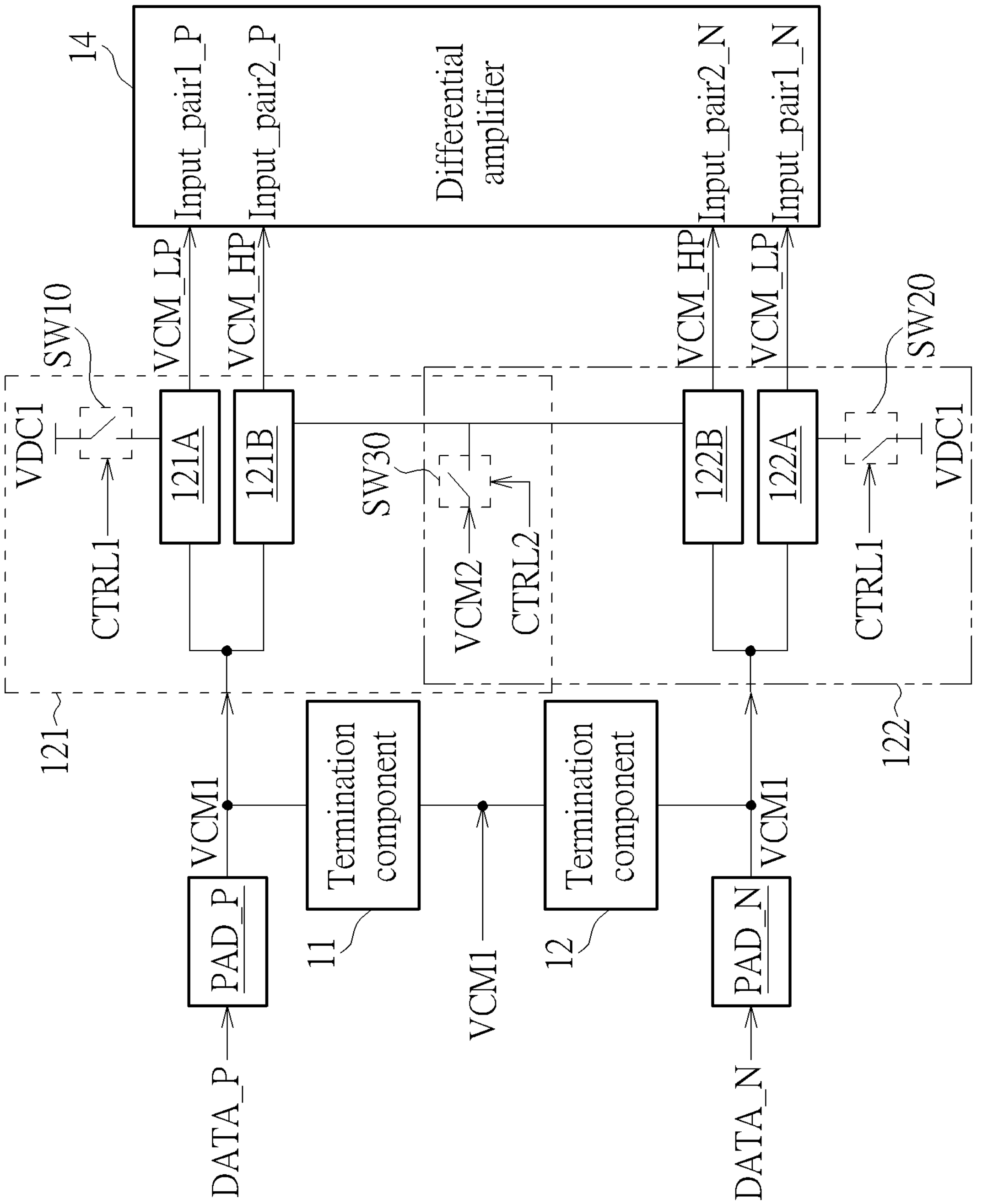
FIG. 5 is a diagram illustrating a second switching control scheme of the method according to an embodiment of the present invention.

FIG. 5 is a diagram illustrating a second switching control scheme of the method according to an embodiment of the present invention. In this embodiment, the above-mentioned switches SW11, SW12, SW21 and SW22 can be omitted. For brevity, similar descriptions for this embodiment are not repeated in detail here.

Figure 6:
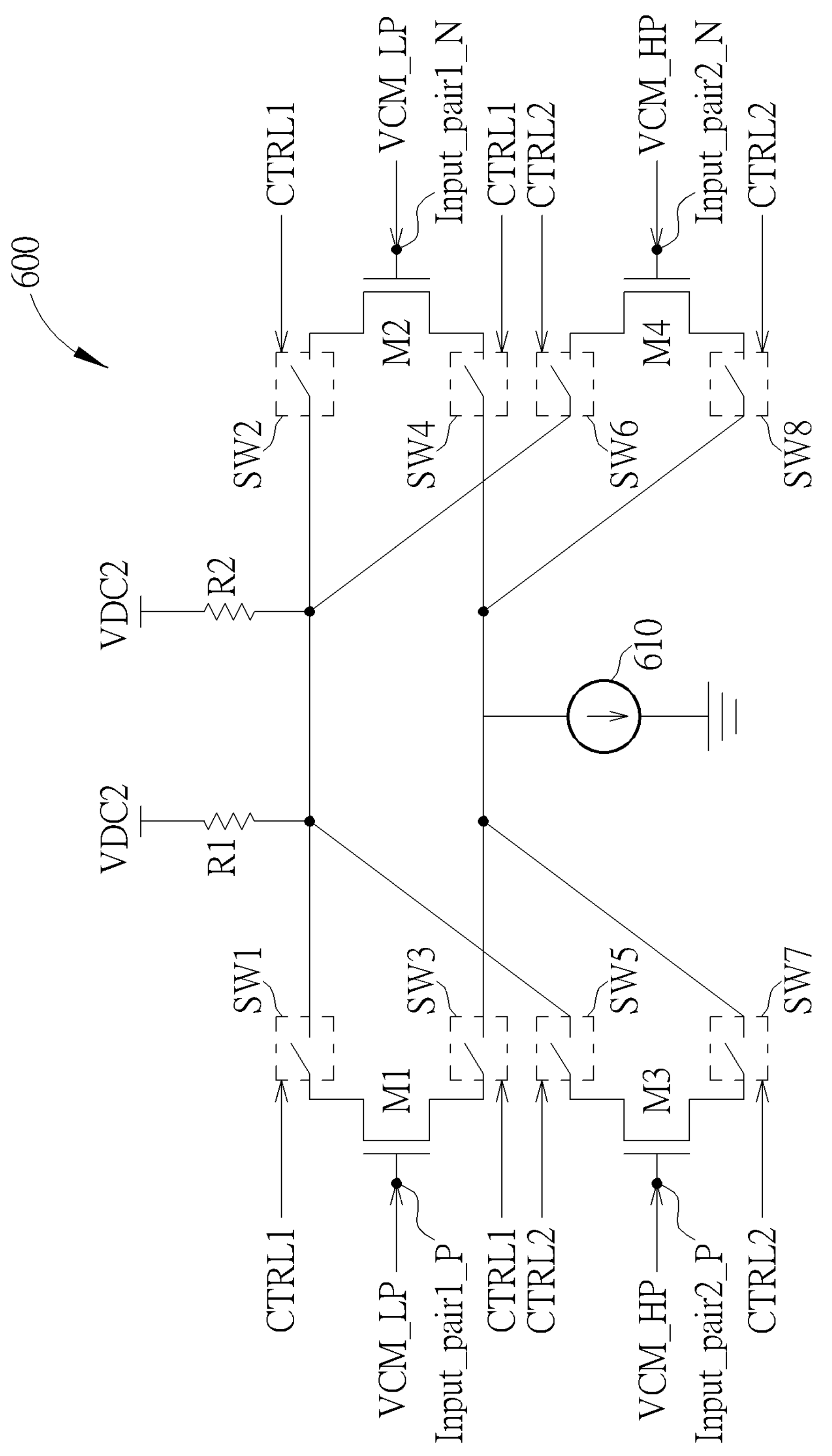
FIG. 6 is a diagram illustrating a parasitic capacitance minimization switching control scheme of the method according to an embodiment of the present invention.

FIG. 6 is a diagram illustrating a parasitic capacitance minimization switching control scheme of the method according to an embodiment of the present invention. An input stage circuit 600 in the differential amplifier 14 may comprise a current source 610, a plurality of resistors R1 and R2 coupled to the reference voltage VDC2, a plurality of transistors M1-M4, and a plurality of switches SW1-SW8, where the gates of the transistors M1-M4 are respectively coupled to the differential input terminals Input_pair1_P, Input_pair1_N, Input_pair2_P and Input_pair2_N of the differential amplifier 14, and the reference voltage VDC2 may represent a predetermined reference voltage. As the common mode voltage re-biasing circuit 100 and the input stage circuit 600 can simultaneously perform switching according to the aforementioned at least one control signal such as the control signals CTRL1 and CTRL2, the receiver 10R can minimize the influence of parasitic effects between the respective architectures to guarantee the signal quality of high speed transmission. For brevity, similar descriptions for this embodiment are not repeated in detail here.

Figure 7:
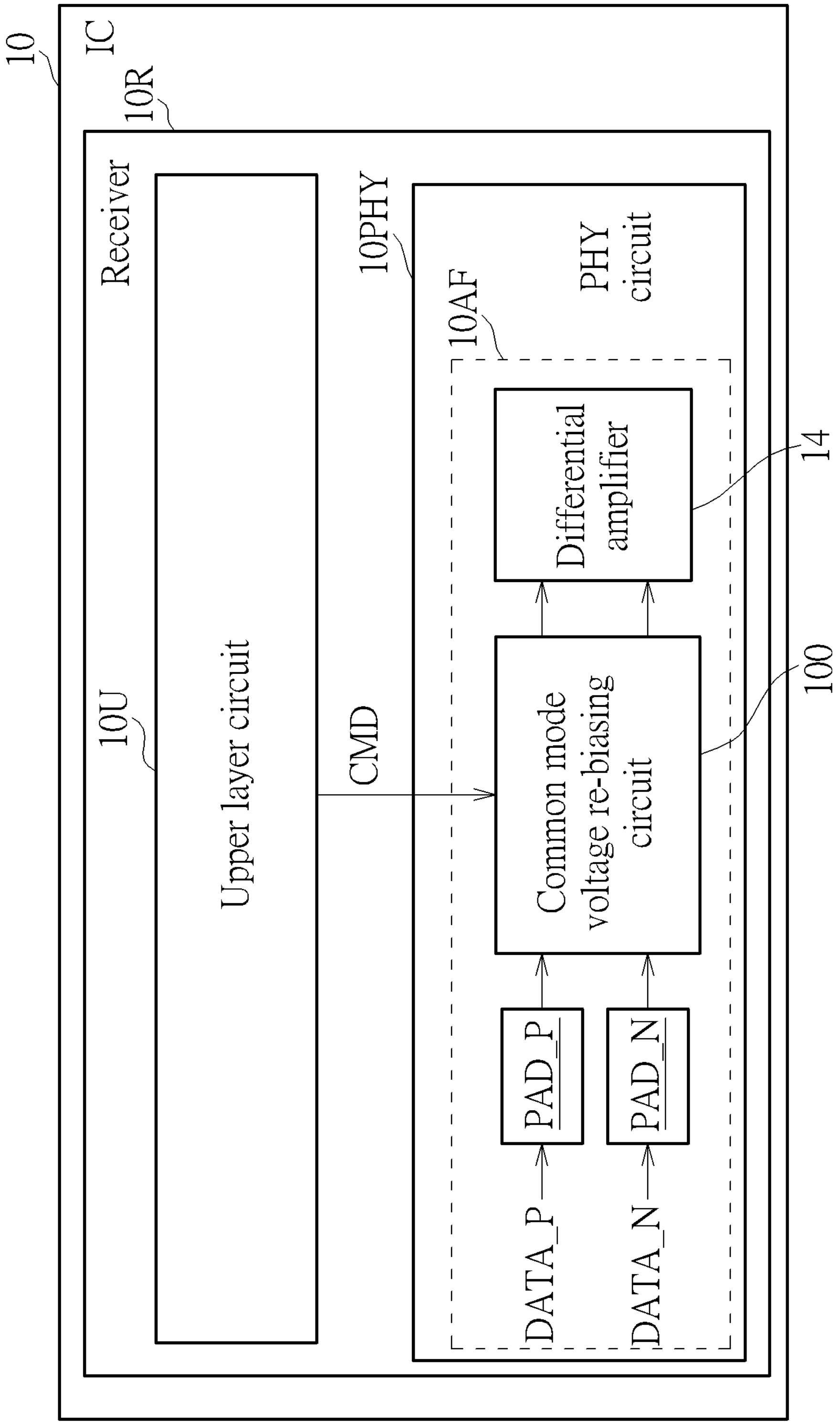
FIG. 7 is a diagram illustrating an IC that operates according to the method according to an embodiment of the present invention.

FIG. 7 is a diagram illustrating an IC 10 that operates according to the method according to an embodiment of the present invention, where the IC 10 may comprise the receiver 10R shown in FIG. 1. According to this embodiment, the receiver 10R may comprise a physical layer (PHY) circuit 10PHY and an upper layer circuit 10U such as a media access control (MAC) layer circuit, where the PHY circuit 10PHY may comprise the common mode voltage re-biasing circuit 100. The upper layer circuit 10U can select a predetermined communications mode from a plurality of predetermined communications modes to be a selected communications mode, and send the command CMD according to the selected communications mode, to make the selected circuit configuration correspond to the selected communications mode. For example, the control circuit 110 can selectively enable the first-type common mode voltage re-biasing sub-circuits 121A and 122A or the second-type common mode voltage re-biasing sub-circuit 121B and 122B through the aforementioned at least one control signal such as the control signals CTRL1 and CTRL2, in order to conform to the selected communications mode of the receiver 10R, where the selected communications mode is selected from the plurality of predetermined communications modes, and the respective communications speeds (e.g., transfer rates) of the plurality of predetermined communications modes are different from each other. Therefore, the common mode voltage re-biasing circuit 100 can simultaneously guarantee the signal quality of high-speed and low-speed transmission. For brevity, similar descriptions for this embodiment are not repeated in detail here.

According to some embodiments, the plurality of predetermined communications modes may comprise communications modes of different generations (Gen) of the Peripheral Component Interconnect Express (PCIe) standard, such as the communications modes of PCIe $1^{st}$ Generation (Gen 1/Gen1) to $5^{th}$ Generation (Gen 5/Gen5), etc., where the transfer rates of PCIe Gen 1 to Gen 5 can be 2.5 Gigabits per seconds (Gbps), 5 Gbps, 8 Gbps, 16 Gbps and 32 Gbps, respectively, but the invention is not limited to this. In addition, the common mode voltage re-biasing circuit 100 can switch among different types of circuit architectures when the receiver 10R operates at the transfer rates of different generations. When the receiver 10R operates at a lower transfer rate such as 2.5 Gbps of PCIe Gen 1, the common mode voltage re-biasing circuit 100 can use the first circuit architectures with low-pass effects (e.g., the circuit architectures in the first predetermined circuit configuration shown in FIG. 2), where the resistors R11, R12, R21 and R22 can be designed to have larger resistance values to achieve the effect of power saving. When the receiver 10R operates at a higher transfer rate such as 32 Gbps of PCIe Gen 5, the common mode voltage re-biasing circuit 100 can use the second circuit architectures with high-pass effects (e.g., the circuit architectures in the second predetermined circuit configuration shown in FIG. 3), where the capacitors C10 and C20 can be designed to have smaller capacitance values to achieve the purpose of saving the die area. For brevity, similar descriptions for these embodiments are not repeated in detail here.

Figure 8:
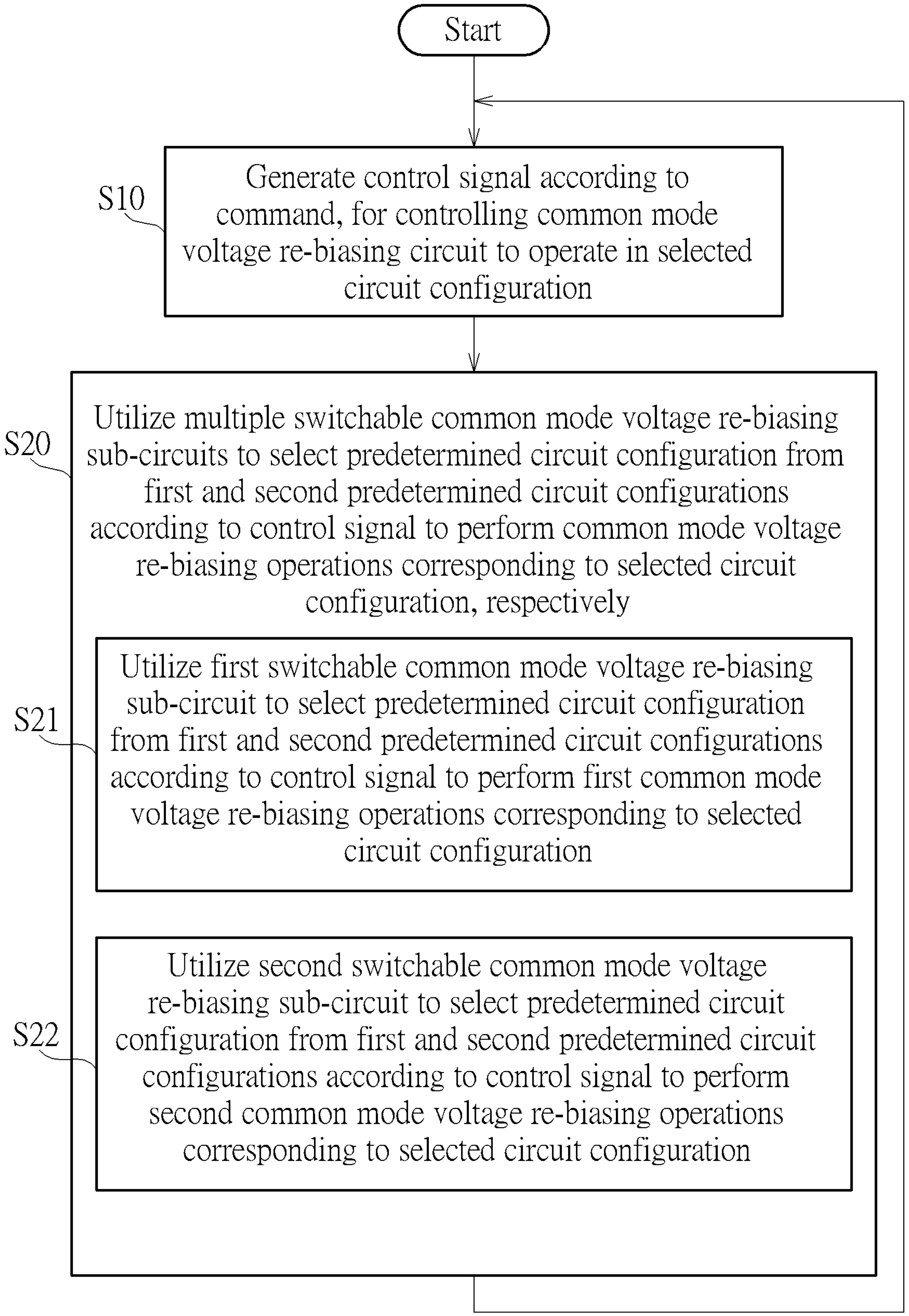
FIG. 8 illustrates a working flow of the method according to an embodiment of the present invention.

FIG. 8 illustrates a working flow of the method according to an embodiment of the present invention. Steps S10 and S20 may be performed repeatedly to dynamically adjust the circuit configuration of the common mode voltage re-biasing circuit 100, and Step S20 may comprise multiple sub-steps such as Steps S21 and S22, the operations of which may be performed in parallel.

In Step S10, the common mode voltage re-biasing circuit 100 can utilize the control circuit 110 to generate the aforementioned at least one control signal such as the control signals CTRL1 and CTRL2 according to the command CMD, for controlling the common mode voltage re-biasing circuit 100 to operate in a selected circuit configuration such as the selected circuit configuration above.

In Step S20, the common mode voltage re-biasing circuit 100 can utilize the multiple switchable common mode voltage re-biasing sub-circuits (e.g., the switchable common mode voltage re-biasing sub-circuits 121 and 122) of the common mode voltage re-biasing circuit 100 to select a predetermined circuit configuration such as the predetermined circuit configuration mentioned above from the first predetermined circuit configuration and the second predetermined circuit configuration according to the aforementioned at least one control signal such as the control signals CTRL1 and CTRL2 to be the selected circuit configuration to perform common mode voltage re-biasing operations corresponding to the selected circuit configuration, respectively.

In Step S21, the common mode voltage re-biasing circuit 100 can utilize the switchable common mode voltage re-biasing sub-circuit 121 to select the predetermined circuit configuration from the first predetermined circuit configuration and the second predetermined circuit configuration according to the aforementioned at least one control signal such as the control signals CTRL1 and CTRL2 to be the selected circuit configuration to perform first common mode voltage re-biasing operations corresponding to the selected circuit configuration.

In Step S22, the common mode voltage re-biasing circuit 100 can utilize the switchable common mode voltage re-biasing sub-circuit 122 to select the predetermined circuit configuration from the first predetermined circuit configuration and the second predetermined circuit configuration according to the aforementioned at least one control signal such as the control signals CTRL1 and CTRL2 to be the selected circuit configuration to perform second common mode voltage re-biasing operations corresponding to the selected circuit configuration.

During maintaining the common mode voltage VCM2, the common mode voltage re-biasing circuit 100 can dynamically control the common mode voltage re-biasing operations to correspond to the currently selected circuit configuration, to guarantee the communications quality of various communications modes. Therefore, the method, the common mode voltage re-biasing circuit 100, the receiver 10R and the IC 10 of the present invention can achieve the optimal performance of an electronic product without introducing side effects, or in a way that is less likely to introduce a side effect. For brevity, similar descriptions for this embodiment are not repeated in detail here.

For better comprehension, the method may be illustrated with the working flow shown in FIG. 8, but the present invention is not limited thereto. According to some embodiments, one or more steps may be added, deleted, or changed in the working flow shown in FIG. 8.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A common mode voltage re-biasing circuit, for performing common mode voltage re-biasing in an analog front-end circuit of a receiver, the common mode voltage re-biasing circuit comprising:

a control circuit, configured to generate at least one control signal according to a command, for controlling the common mode voltage re-biasing circuit to operate in a selected circuit configuration; and multiple switchable common mode voltage re-biasing sub-circuits, coupled to the control circuit, configured to select a predetermined circuit configuration from a first predetermined circuit configuration and a second predetermined circuit configuration according to the at least one control signal to be the selected circuit configuration to perform common mode voltage re-biasing operations corresponding to the selected circuit configuration, respectively, wherein the multiple switchable common mode voltage re-biasing sub-circuits comprise:

a first switchable common mode voltage re-biasing sub-circuit, positioned in the analog front-end circuit of the receiver and coupled to a first differential input terminal of the receiver, wherein the first switchable common mode voltage re-biasing sub-circuit comprises:

a first-type common mode voltage re-biasing sub-circuit, having a first circuit architecture; and a second-type common mode voltage re-biasing sub-circuit, having a second circuit architecture, wherein the second circuit architecture is different from the first circuit architecture; and a second switchable common mode voltage re-biasing sub-circuit, positioned in the analog front-end circuit of the receiver and coupled to a second differential input terminal of the receiver, wherein the second switchable common mode voltage re-biasing sub-circuit comprises:

another first-type common mode voltage re-biasing sub-circuit, having another first circuit architecture that is the same as the first circuit architecture; and another second-type common mode voltage re-biasing sub-circuit, having another second circuit architecture that is the same as the second circuit architecture;

wherein any of the first circuit architecture and said another first circuit architecture comprises a first resistor and a second resistor, and any of the second circuit architecture and said another second circuit architecture comprises a third resistor and a capacitor.

2. The common mode voltage re-biasing circuit of claim 1, wherein the control circuit selectively enables the first-type common mode voltage re-biasing sub-circuit and said another first-type common mode voltage re-biasing sub-circuit or enables the second-type common mode voltage re-biasing sub-circuit and said another second-type common mode voltage re-biasing sub-circuit through the at least one control signal.

3. The common mode voltage re-biasing circuit of claim 2, wherein when enabling the first-type common mode voltage re-biasing sub-circuit and said another first-type common mode voltage re-biasing sub-circuit, the control circuit selectively disables the second-type common mode voltage re-biasing sub-circuit and said another second-type common mode voltage re-biasing sub-circuit; and when enabling the second-type common mode voltage re-biasing sub-circuit and said another second-type common mode voltage re-biasing sub-circuit, the control circuit selectively disables the first-type common mode voltage re-biasing sub-circuit and said another first-type common mode voltage re-biasing sub-circuit.

4. The common mode voltage re-biasing circuit of claim 1, wherein the control circuit selectively enables the first-type common mode voltage re-biasing sub-circuits or the second-type common mode voltage re-biasing sub-circuits through the at least one control signal, in order to conform to a selected communications mode of the receiver.

5. The common mode voltage re-biasing circuit of claim 4, wherein the selected communications mode is selected from a plurality of predetermined communications modes, wherein respective communications speeds of the plurality of predetermined communications modes are different from each other.

6. The common mode voltage re-biasing circuit of claim 1, wherein for a set of differential input signals received by the receiver, a first frequency response of any switchable common mode voltage re-biasing sub-circuit among the first switchable common mode voltage re-biasing sub-circuit and the second switchable common mode voltage re-biasing sub-circuit when operating in the first predetermined circuit configuration and a second frequency response of said any switchable common mode voltage re-biasing sub-circuit when operating in the second predetermined circuit configuration are different from each other.

7. The receiver comprising the common mode voltage re-biasing circuit of claim 1, wherein the receiver comprises:

a physical layer (PHY) circuit, wherein the PHY circuit comprises the common mode voltage re-biasing circuit; and an upper layer circuit, configured to select a predetermined communications mode from a plurality of predetermined communications modes to be a selected communications mode, and send the command according to the selected communications mode, to make the selected circuit configuration correspond to the selected communications mode.

8. An integrated circuit comprising the receiver of claim 7.

9. A method for performing common mode voltage re-biasing in an analog front-end circuit of a receiver, the method comprising:

generating at least one control signal according to a command, for controlling a common mode voltage re-biasing circuit to operate in a selected circuit configuration; and utilizing multiple switchable common mode voltage re-biasing sub-circuits of the common mode voltage re-biasing circuit to select a predetermined circuit configuration from a first predetermined circuit configuration and a second predetermined circuit configuration according to the at least one control signal to be the selected circuit configuration to perform common mode voltage re-biasing operations corresponding to the selected circuit configuration, respectively, wherein the multiple switchable common mode voltage re-biasing sub-circuits comprise a first switchable common mode voltage re-biasing sub-circuit and a second switchable common mode voltage re-biasing sub-circuit, and the first switchable common mode voltage re-biasing sub-circuit and the second switchable common mode voltage re-biasing sub-circuit are positioned in the analog front-end circuit of the receiver and are coupled to a first differential input terminal and a second differential input terminal of the receiver, respectively, wherein:

the first switchable common mode voltage re-biasing sub-circuit comprises:

a first-type common mode voltage re-biasing sub-circuit, having a first circuit architecture; and a second-type common mode voltage re-biasing sub-circuit, having a second circuit architecture, wherein the second circuit architecture is different from the first circuit architecture; and the second switchable common mode voltage re-biasing sub-circuit comprises:

another first-type common mode voltage re-biasing sub-circuit, having another first circuit architecture that is the same as the first circuit architecture; and another second-type common mode voltage re-biasing sub-circuit, having another second circuit architecture that is the same as the second circuit architecture;

wherein any of the first circuit architecture and said another first circuit architecture comprises a first resistor and a second resistor, and any of the second circuit architecture and said another second circuit architecture comprises a third resistor and a capacitor.

* * * * *